(12) United States Patent
Taft

(10) Patent No.: US 7,920,084 B2
(45) Date of Patent: *Apr. 5, 2011

(54) UNIFIED ARCHITECTURE FOR FOLDING ADC

(75) Inventor: Robert Callaghan Taft, Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/660,743

(22) Filed: Mar. 3, 2010

(65) Prior Publication Data

US 2010/0156691 A1    Jun. 24, 2010

Related U.S. Application Data

(63) Continuation of application No. 12/234,868, filed on Sep. 22, 2008, now Pat. No. 7,710,305.

(51) Int. Cl.
  *H03M 1/12* (2006.01)
(52) U.S. Cl. ......... 341/156; 341/159; 341/161; 341/162
(58) Field of Classification Search .......... 341/156, 341/161
  See application file for complete search history.

(56) References Cited

U.S. PATENT DOCUMENTS

| | | | | |
|---|---|---|---|---|
| 4,599,602 A | * | 7/1986 | Matzuzawa et al. | 341/161 |
| 4,931,797 A | * | 6/1990 | Kagawa et al. | 341/162 |
| 5,719,578 A | * | 2/1998 | Bohme | 341/161 |
| 6,346,904 B1 | * | 2/2002 | Gaillard et al. | 341/155 |
| 6,950,051 B2 | | 9/2005 | Lee et al. | |
| 6,972,706 B2 | * | 12/2005 | Snoeijs | 341/158 |
| 7,403,149 B2 | | 7/2008 | Kim | |
| 2007/0115162 A1 | | 5/2007 | Kim | |

FOREIGN PATENT DOCUMENTS

KR    1020020010973 A    2/2002

OTHER PUBLICATIONS

Cheng-Chung Hsu, et al., A 10b 200MS/s Pipelined Folding ADC with Offset Calibration, 2007 IEEE, p. 151-154.
Seung-Chul Lee, et al., "A 9-Bit 80-MS/s CMOS Pipelined Folding A/D Converter with an Offset Canceling Technique", ETRI Journal, vol. 29, No. 3, Jun. 2007, p. 408-410.
Notification of Transmittal of the International Search Report and the Written Opinion of the International Searching Authority, or the Declaration dated May 10, 2010 in connection with International Patent Application No. PCT/US2009/005225.
Pieter Vorenkamp, et al., "A 12-b, 60-MSample/s Cascaded Folding and Interpolating ADC", IEEE Journal of Solid-State Circuits, vol. 32, No. 12, Dec. 1997, p. 1876-1886.
Klaas Bult, et al., "An Embedded 240-Mw 10-b 50-MS/s CMOS ADC in 1-mm2", IEEE Journal of Solid-State Circuits, vol. 32, No. 12, Dec. 1997, p. 1887-1895.
Gian Hoogzaad, et al., "A 65-Mw, 10-bit, 40-Msample/s BiCMOS Nyquist ADC in 0.8 mm2", IEEE Journal of Solid-State Circuits, vol. 34, No. 12, Dec. 1999, p. 1796-1802.

* cited by examiner

*Primary Examiner* — Khai M Nguyen

(57) ABSTRACT

A system, apparatus and method for a folding analog-to-digital converter (ADC) are described. The general architecture of the folding ADC includes an array (1-N) of cascaded folding amplifier stages, a distributed array of fine comparators, and an encoder. Each folding amplifier stage includes folding amplifiers that are configured to receive inputs from a prior stage, and also generate output signals for the next stage. The folding amplifiers output signals for a given stage are evaluated by a corresponding comparator stage, which may include multiple comparators, and also optionally coupled to an interpolator. The outputs of the comparators from all stages are collectively evaluated by the encoder, which generates the output of the folding ADC. Unlike conventional folding ADCs that require fine and coarse channels, the presently described folding ADC provides conversion without the need for a coarse channel. The encoder can also be arranged to facilitate recursive error correction.

20 Claims, 9 Drawing Sheets ures. The size and cost of the numerous comparators may be impracticable for many applications (e.g., an 8-bit converter can require more than 255 comparators). In place of the comparators, many other high speed ADC circuits (e.g., pipeline and folding converters) substitute more complex architectures requiring fewer comparators.

UNIFIED ARCHITECTURE FOR FOLDING ADC

This application is a continuation of prior U.S. patent application Ser. No. 12/234,868 filed on Sep. 22, 2008 now U.S. Pat. No. 7,710,305.

FIELD OF INVENTION

The present description relates to a system, method and apparatus generally related to folding analog-to-digital converter (ADC) circuits. More particularly, the present disclosure details a unified architecture for a folding ADC where coarse and fine comparator functions are combined. The disclosed architecture can be further modified to include recursive error correction.

BACKGROUND

ADC circuits are useful in many applications where it may be desirable to quantize an analog input signal into a digital output signal. A variety of ADC architectures have been employed in conventional architectures including flash converters, folding converters, sub-ranging converters, multi-step converters, pipeline converters and successive approximation converters.

Flash converters are typically faster than other types of conventional ADC circuits such as successive approximation converters. However, a high precision flash converter may require a huge number of comparators compared to other ADCs, especially as the precision increases. For example, a typical n-bit flash converter may require $2^n-1$ comparators. The size and cost of the numerous comparators may be impracticable for many applications (e.g., an 8-bit converter can require more than 255 comparators). In place of the comparators, many other high speed ADC circuits (e.g., pipeline and folding converters) substitute more complex architectures requiring fewer comparators.

A folding ADC is similar in basic architecture to a flash converter, where the overall number of comparators is reduced by adding a folding circuit to the front end of the conversion. Instead of using the comparators to distinguish just one code transition as in a typical flash converter, a folding ADC converter re-uses the existing comparators multiple times. If an m times folding circuit is used in an n-bit ADC, the actual number of comparator can be reduced from $2^n-1$, to $2^n/m$, where m is the number of folded regions for the folding operation. Typical folding circuits can also be referred to as Gilbert multiplier circuits or analog wired-OR circuits.

An example folding ADC is illustrated in FIG. 1A. The folding ADC includes a reference circuit, an array (1-N) of cascaded folding amplifier stages, an array of fine-resolution comparator circuits, one or more coarse amplifier circuits, one or more coarse comparator circuits, and an encoder circuit. An input signal (VIN) is applied to the input of the cascaded folding amplifier stages, and also to the coarse amplifier circuits. The reference circuit is arranged to provide reference levels to the first stage of the cascaded folding amplifier circuits, and also to the first stage of the coarse amplifier circuits. Optionally, a track and hold circuit can be used to supply the input signals to the amplifiers. In addition, an optional first stage (STAGE 0) can be used to combine the input signal with the reference voltages and provide voltage amplification. The outputs of the cascaded folding amplifier stages are applied to an input of the fine comparator circuits. The outputs of the coarse amplifier circuits are applied to an input of the coarse comparator circuits. The output of the fine and coarse comparator circuits are evaluated by the encoder, which in turn generates a group of least significant bits (LSB Bits) and most significant bits (MSB bits), which corresponds to the output of the converter. The folding converter determines the LSB Bits through the use of analog preprocessing with a folding converter topology including the cascaded folding amplifier stages and the fine comparators. The MSB Bits are determined by a coarse converter topology including the coarse amplifiers and the coarse comparators. An additional synchronization bit can be used to make sure that the MSB and LSB evaluation is done consistently, especially when the input signal is at the boundary of a MSB code transition.

In an example 5-bit folding ADC, 10 comparators can be used as the fine and coarse converter circuits. For example, as illustrated in FIG. 1B, MSB Bits are found by comparing the input signal (VIN) to three different thresholds (e.g., VFSx ¼, ½ and ¾) as a percentage of the full scale voltage (VFS) to provide a two-bit output by decoding the output from three comparators. As illustrated in FIG. 1C, LSB Bits can be found by cyclically (through the folding amplifier) comparing the input signal (YIN) to seven thresholds (e.g., VFSx ⅐, ²⁄₇ ... 1). between as a percentage of the full scale voltage (VFS) to provide a three-bit output from seven comparators.

BRIEF DESCRIPTION OF THE DRAWINGS

Non-limiting and non exhaustive embodiments are described with reference to the following drawings.

DETAILED DESCRIPTION

Figure 1A:
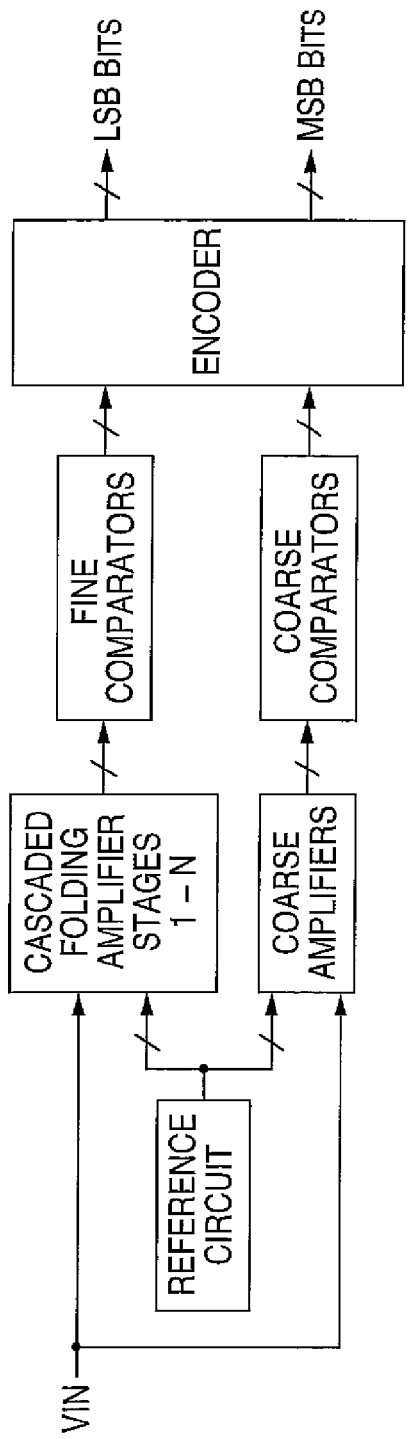
FIGS. 1A-1C illustrate an example of a conventional folding amplifier converter architecture.

Various embodiments will be described in detail with reference to the drawings, where like reference numerals represent like parts and assemblies throughout the several views. References to various embodiments do not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electro-magnetic, mechanical, logical, or other connection between the items connected, without any electrical, mechanical, logical or other intermediary items. The term "coupled" can mean a direct connection between items, an indirect connection through one or more intermediaries, or communication between items in a manner that may not constitute a physical connection. The term "circuit" can mean a single component or a plurality of components, active and/or passive, discrete or integrated, that are coupled together to provide a desired function. The term "signal" can mean at least one current, voltage, charge, data or other such identifiable quantity including electrically coupled and magnetically coupled signals.

Briefly stated, the present disclosure relates to a system, apparatus and method for a folding analog-to-digital converter (ADC). The general architecture of the folding ADC includes an array (1-N) of cascaded folding amplifier stages, a distributed array of fine comparators, and an encoder. The cascaded folding amplifiers need not all have the same order (or factor) of folding and may include an additional amplification circuit and/or pipelining (distributed sampling) to allow increased settling times for the signals, thus maximizing the conversion speed. Each folding amplifier stage includes folding amplifiers that are configured to receive inputs from a prior stage, and also generate output signals for the next stage. These outputs may also optionally be increased in number by coupling to an interpolator. The folding amplifiers output signals for a given stage are evaluated by a corresponding comparator stage, which may include multiple comparators. The outputs of the comparators from all stages are collectively evaluated by the encoder, which generates the output of the folding ADC. Unlike conventional folding ADCs that require fine and coarse channels, the presently described folding ADC provides conversion without the need for a coarse channel. The encoder can also be arranged to facilitate recursive error correction.

Figure 1B:
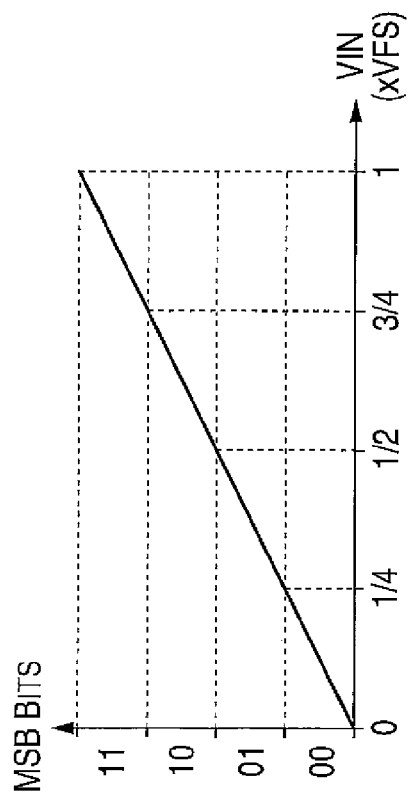
Figure 1C:
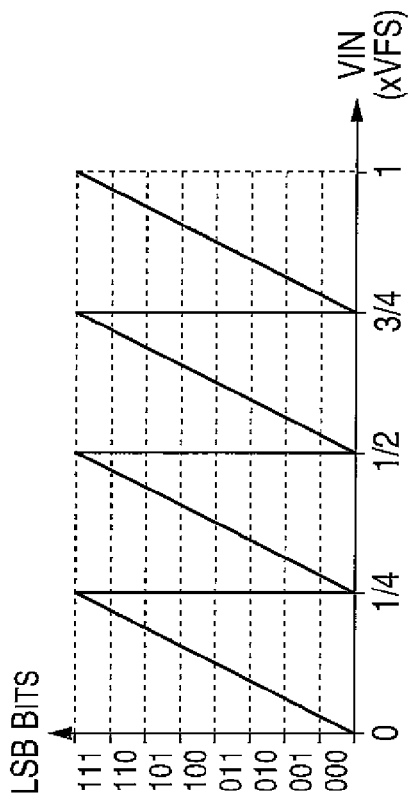

Folding ADCs utilize folding amplifier circuits as described in FIGS. 1A-1C. The amplifiers in the ADC don't physically "fold", but instead combine the outputs of the various amplifier in a given stage so that multiple zero crossings can be detected at the output rather than just a single zero crossing. The observable effect of a folding amplifier stage is that the output waveform does not continue in a straight line with a fixed slope, and instead has a series of sloped lines. Therefore, the term "folding" is used to refer to the nature of the input to output relationship for each folding amplifier stage.

Conventional folding converters, such as illustrated in FIG. 1A, include a coarse channel and a fine channel. The coarse channel is comprised of coarse amplifiers and corresponding comparators, while the fine channel is comprised of a single amplifier or cascaded folding amplifiers and corresponding comparators. The folding amplifiers have an effective input to output relationship that appears as folded curves, where the coarse channel is utilized to localize which of the folds (the sloped curve region) the input signal falls within.

The present disclosure contemplates higher resolution folding ADCs (e.g., folding ADCs with more than 6-bits of conversion). The higher resolution greatly benefits from a higher order of folding operations, but the increased number of folding operations leads to more closely spaced folds that make alignment and calibration between the "fine" channel and the "coarse" channel increasingly difficult. Also contemplated in the present disclosure is that as resolution increases in a conventional folding ADC which limits the factor of folding to example only 3, the number of comparators required by the coarse and fine channels increases dramatically, leading to increased power, increased die area, and increased loading on the input. For example, an example of an 8-bit folding ADC with a folding factor of 3 includes approximately 85 comparators ($2^8/3$), while a 10-bit folding ADC with a folding factor of three includes approximately 341 comparators ($2^{10}/3$).

The presently described architecture eliminates the use of the coarse channel in a folding ADC, and instead uses a single "unified" set of cascaded folding stages. The described unified architecture reduces power consumption and die area since the coarse channel is eliminated, and fewer comparators are required. The need for a distinct coarse channel has been eliminated by embedding comparators at the outputs of each of the cascaded folding-amplifier stages.

Figure 2A:
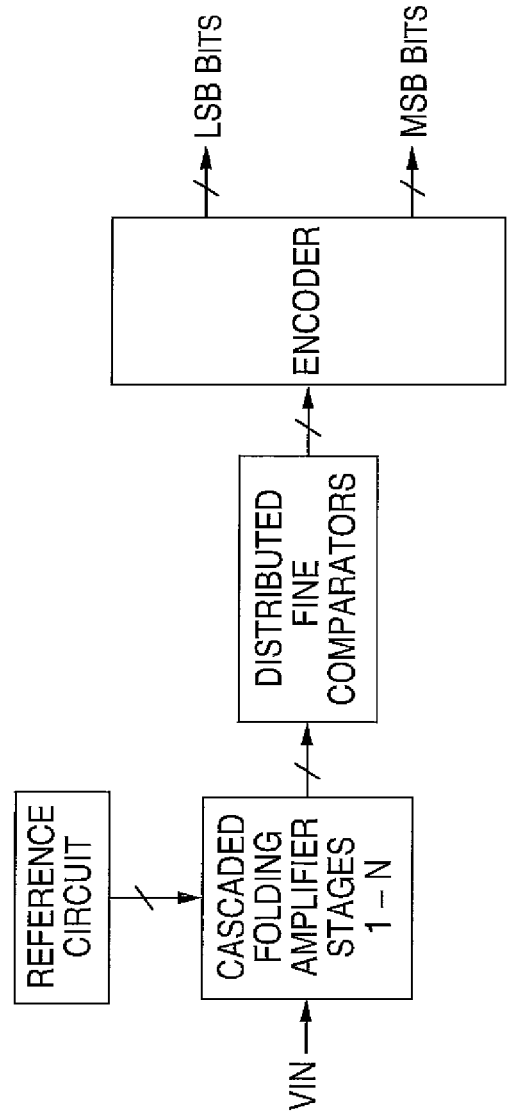
FIG. 2A illustrates a high level block diagram of the proposed unified-folding ADC.

FIG. 2A illustrates a high level block diagram of a folding ADC arranged in accordance with the present disclosure. As illustrated, the folding ADC includes a reference circuit, cascaded folding amplifier input stages 1-N, distributed fine comparators for each of the folding amplifier stages, and an encoder. The block diagram is similar to FIG. 1A, except that the functions of the coarse channel (i.e., the coarse amplifiers and coarse comparators) is eliminated, and the fine comparators are distributed as will be described with reference to FIG. 2B.

Figure 2B:
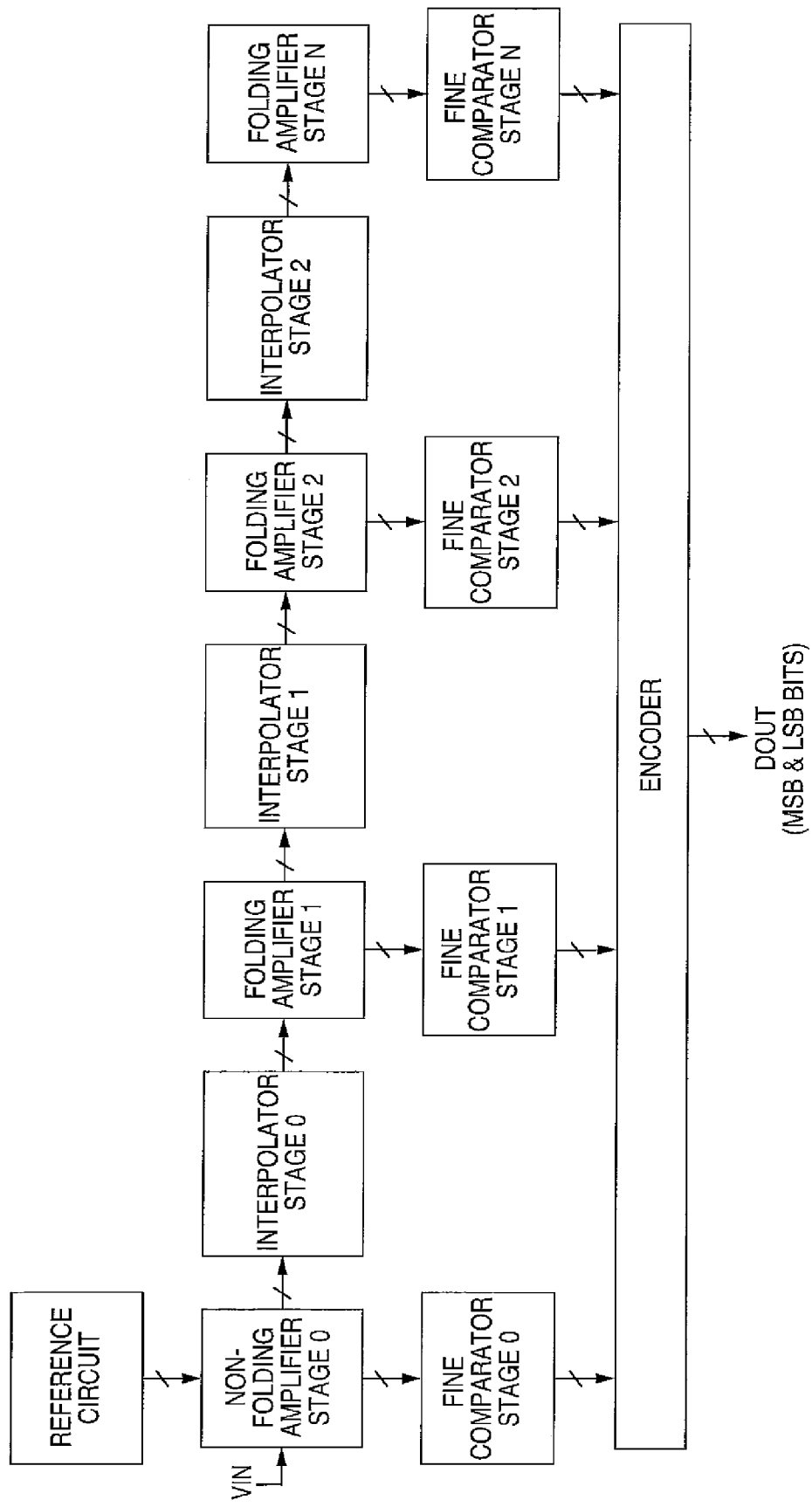
FIG. 2B illustrates a detailed block level diagram of the proposed unified-folding ADC.

FIG. 2B illustrates a detailed block level diagram of a folding ADC arranged in accordance with the present disclosure. As illustrated, the folding ADC includes a reference circuit, a non-folding amplifier (STAGE 0), folding amplifier stages 1 through N, and fine comparator stages 0 through N. Optional interpolator stages 0 through N−1 are also illustrated.

The non-folding amplifier stage (i.e., STAGE 0) is arranged to receive an input signal (VIN) and a series of reference signal levels (e.g., REF1, REF2, REF3 . . . ), and generates a first set of output signals (e.g., VOUT01, VOUT02 . . . ). Selected output signals from the STAGE 0 amplifier (i.e., the non-folding amplifier) are coupled to a corresponding fine comparator stage (i.e., Fine Comparator STAGE 0), and also all outputs from the STAGE 0 amplifier are (optionally) coupled to a corresponding interpolator stage (i.e., Interpolator STAGE 0). The output terminals of the STAGE 0 interpolator stage are coupled to the input terminals of the first folding amplifier stage (i.e., STAGE 1). Selected output signals from the first stage amplifier are coupled to a corresponding fine comparator stage (i.e., Fine Comparator STAGE 1), and also all outputs from the STAGE 1 amplifier are (optionally) coupled to a corresponding interpolator stage (i.e., Interpolator STAGE 1). The output terminals of the STAGE 1 interpolator stage are coupled to the input terminals of the second folding amplifier stage (i.e., STAGE 2). Selected output signals from the second stage amplifier are coupled to a corresponding fine comparator stage (i.e., Fine Comparator STAGE 2), and also all outputs from the STAGE 2 amplifier are (optionally) coupled to a corresponding interpolator stage (i.e., Interpolator STAGE 2). Additional folding amplifier stages/interpolator stages are similarly cascaded until the last folding amplifier stage (i.e., STAGE N), which does not require an interpolator if sufficient parallel signals are present to connect to the final set of comparators. The outputs of all of the comparators are coupled to the encoder block, which is configured to evaluate the various outputs from the comparators and identify an output code (e.g., DOUT) consisting of MSB and LSB bits.

Figure 2C:
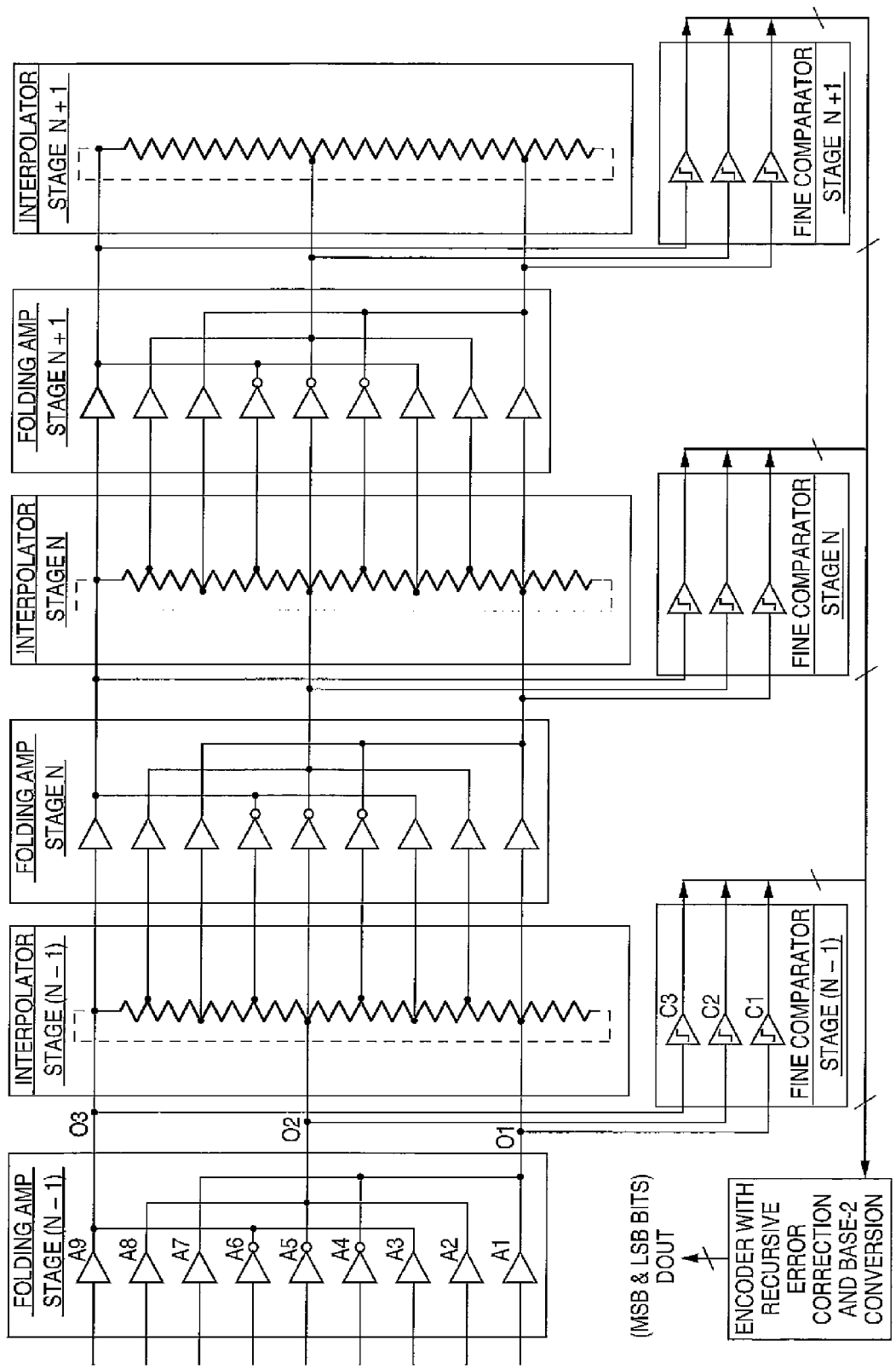
FIG. 2C illustrates a detailed schematic diagram of the proposed unified-folding ADC.

Each of the folding amplifier stages is selected to have a folding factor such as 2, 3, 4, etc. FIG. 2C illustrates a detailed schematic diagram of a portion of a folding ADC that is arranged in accordance with the present disclosure. As illustrated, the folding ADC includes a plurality of folding amplifier stages (N−1, N, N+1 . . . ), with corresponding interpolator stages and fine comparator stages.

The first folding amplifier stage (N−1) illustrated in FIG. 2C includes nine individual amplifiers (A1-A9), each with a corresponding input and output. In general a large number of parallel amplifiers may be used, typically 27 or more, but the figure has been simplified. The first fine comparator stage (N−1) includes three individual comparators (C1-C3). The polarity of amplifiers A1-A3 and A7-A9 are non-inverting, while the polarity of amplifiers A4-A7 are inverting. Amplifiers A1, A4 and A7 have their outputs tied together to form a first folding amplifier with a first output (O1) that is coupled to an input of comparator C1. Amplifiers A2, A5 and A8 have their outputs tied together to form a second folding amplifier with a second output (O2) that is coupled to an input of comparator C2. Amplifiers A3, A6 and A9 have their outputs tied together to form a third folding amplifier with a third output (O3) that is coupled to an input of comparator C3. The outputs of comparators C1-C3 are coupled to inputs of the encoder.

Use of the folding amplifier arrangement results in a reduction between the number of inputs and corresponding outputs, which corresponds to a loss in signal bus width. An interpolator stage can be inserted between successive folding amplifier stages so that the number of inputs and outputs remains relatively constant. This has the additional advantage that the interpolation increases the resolution of the ADC without the need for an increased number of reference voltages at the first stage of the ADC. For a 3× folding amplifier arrangement, the number of inputs corresponds to nine, while the number of outputs corresponds to three (a 3-1 reduction). For this interpolation example, a tapped resistor network can be used with three inputs and nine outputs so that the input signals for the succeeding stage (e.g., STAGE N) by interpolating between the outputs (O1, O2 and O3). Therefore, the overall signal bus width is approximately restored for the nine inputs of the succeeding stage.

The second folding amplifier stage (N) and the third folding amplifier stage (N+1) are arranged in a cascade fashion, with their inputs similar to the first folding amplifier stage (N−1) as illustrated.

Each of the amplifiers and comparators described for FIG. 2C are illustrated with a single-ended input and a single-ended output. However, it is understood that these typically will represent differential amplifiers/comparators with fully differential inputs and outputs. For example, each comparator can evaluate one of the differential outputs to determine if the polarity (i.e., the difference between positive and negative output terminals of the folding amplifier) is positive or negative. In some example implementations, single-ended differential amplifiers/comparators can be used with the addition of various DC reference levels for the comparators and/or amplifiers.

For the example described in FIG. 2C, three comparators are equally spaced inside each amplifier stage such that their crossing points are folded into the complete analog channel transfer curve as will be described with reference to FIG. 3A. All of the comparator outputs are then evaluated by the encoder so that the exact position of VIN in STAGE N−1 is used to localize the particular fold for STAGE N without using a separate coarse ADC. This is extremely important for the later stages, where high folding orders could make the absolute position of VIN relative to the many folds very difficult to determine. The position of VIN in STAGE N−1 can be iteratively determined by evaluating the comparator outputs from the previous stages. Furthermore, comparator 2 of each stage is actually redundant with comparator 1, 2, or 3 of the previous stage. Thus, while STAGE N−1 localizes the fold for STAGE N, error correction logic in the encoder uses comparator 2's output of the more highly gained STAGE N to correct STAGE N−1's decision, resulting in excellent differential linearity and complete sparkle suppression while requiring only relaxed comparator accuracy.

Embedding comparators also reduces their total number. In an example of a conventional folding 8-bit ADC, 43 comparators are used. Using the present architecture, a 10-bit design can be achieved with only 19 comparators (3 for each folding stage, plus 1 at STAGE 0, the non-folded first flash stage). This cascaded architecture provides a base-3 conversion result when a folding factor of three is used. The encoder complexity can also be high when error correction is utilized, where error correction ripples from the last stage back to the first. Also, since a folding factor of three is used in this example, the results must be converter from base-3 to base-2 by the encoder. However, moving the complexity from the analog domain to the digital (encoder) domain is ideally suited to modern semiconductor processes.

Figure 2D:
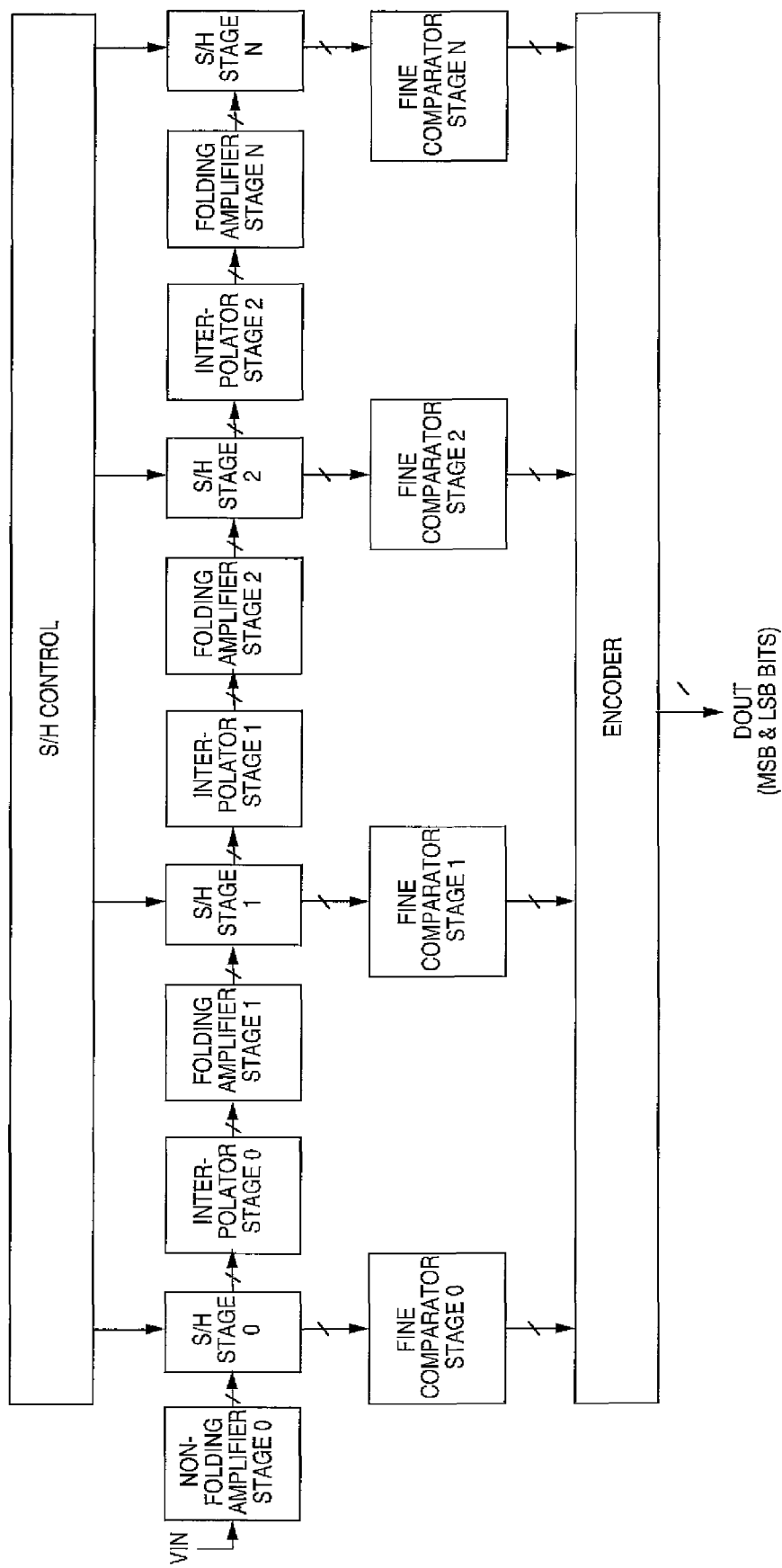
FIG. 2D illustrates another detailed block level diagram of the proposed unified-folding ADC.

FIG. 2D illustrates another detailed block level diagram of a folding ADC arranged in accordance with the present disclosure. As illustrated, the folding ADC includes a reference circuit, a non-folding amplifier (STAGE 0), folding amplifier stages 1 through N, and fine comparator stages 0 through N. Optional interpolator stages 0 through N−1 are also illustrated.

The folding ADC of FIG. 2D is arranged in a substantially similar manner as FIG. 2B. However, in FIG. 2D sample and hold (S/H) stages (STAGES 0 through N) are inserted between the outputs of the amplifiers and the interpolator stages. Each illustrated S/H stage includes an output that is coupled to the corresponding interpolator stage and also coupled to the corresponding comparator stage A sample and hold control circuit (S/H Control) is also illustrated as including control lines for each of the S/H stages. The inclusion of the S/H stages can be used to facilitate pipelining, which can enable the ADC to run at higher speeds by giving the ADC more time for the signals to settle in the amplifier stage.

Each S/H stage can be comprised of one or more individual sample/hold circuits. For example, in some implementations the non-folding amplifier stage includes a single output and thus only a single sample and hold circuit will be required. In other examples such as for folding amplifier stages, a separate sample and hold circuit will be required for each of the outputs. The sample and hold circuits can be implemented as fully differential sample and hold circuits or single-ended sample and hold circuits, as required by the particular system implementation.

Figure 3A:
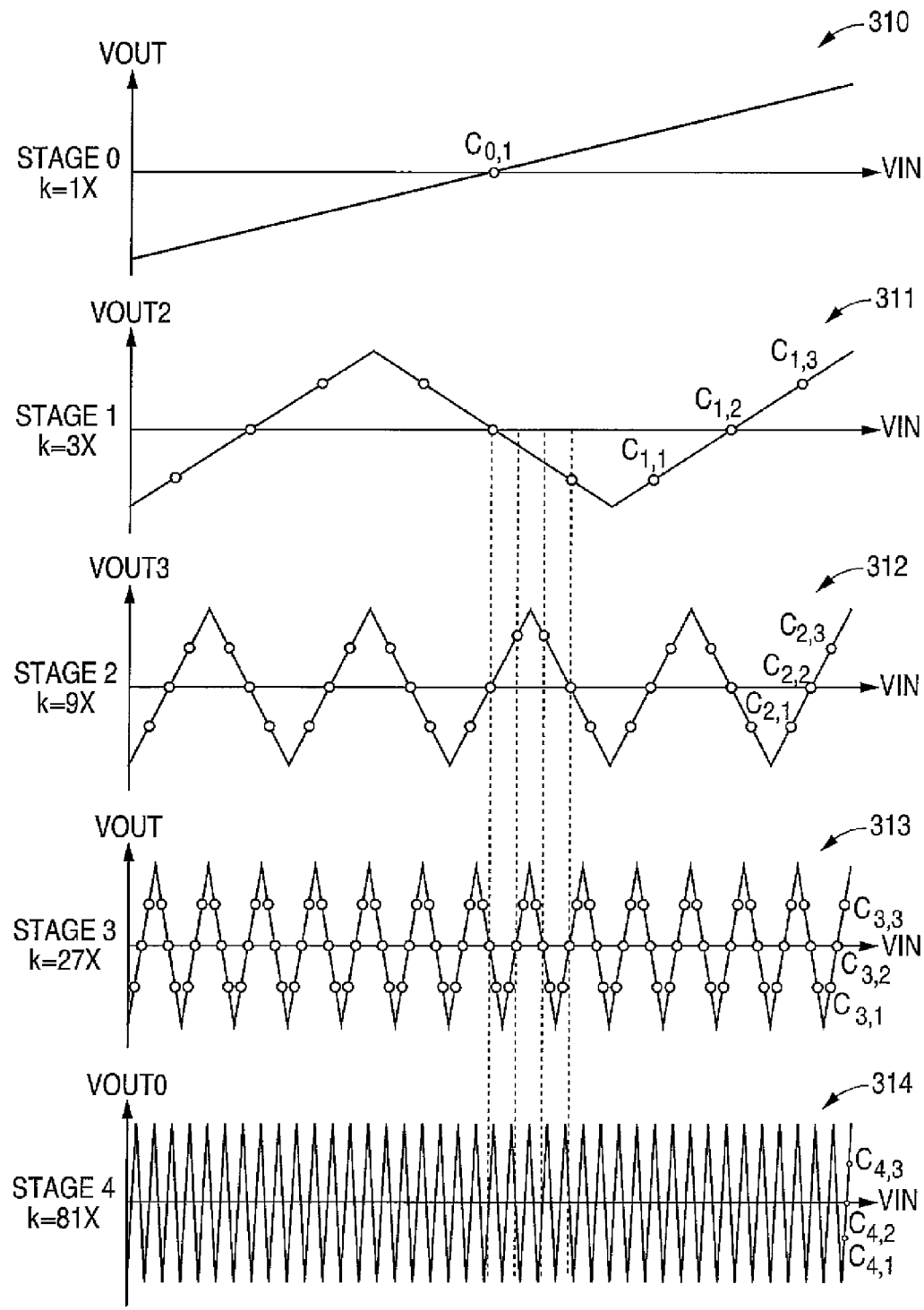
FIG. 3A is a waveform diagram illustrating the operation of an example four stage folding ADC with a folding factor of three.

FIG. 3A is a waveform diagram illustrating the operation of an example four stage folding ADC with a folding factor of three. As illustrated by waveform 310, a non-folding amplifier is utilized for stage zero, and thus a single comparator (C0,1) can be used to detect the zero crossing point. As illustrated by waveform 311, the first folding amplifier stage (STAGE 1) has three (3) zero crossing points, and three comparators (C1,1; C1,2; C1,3) are used as the fine-resolution comparators. As illustrated by waveform 312, the second folding amplifier stage (STAGE 2) has nine ($3^2$) zero crossing points, and three comparators (C2,1; C2,2; C2,3) are used to the fine-resolution comparators. As illustrated by waveform 313, the third folding amplifier stage (STAGE 3) has twenty-seven ($3^3$) zero crossing points, and three comparators (C3,1; C3,2; C3,3) are used as the fine-resolution comparators. As illustrated by waveform 314, the fourth folding amplifier stage (STAGE 4) has eighty-one ($3^4$) zero crossing points, and three comparators (C4,1; C4,2; C4,3) are used as the fine-resolution comparators.

As described previously, the position of VIN in STAGE N−1 can be iteratively determined by the evaluating the comparator outputs from the previous stages. For example, comparator C1,2 at STAGE 1 detects a zero-crossing at three points, where two points occur on a positive slope (or upward direction) and one point occurs on a negative slope (or downward direction) of the curves. If the comparators are cyclically coded (i.e., an upward trending code is different from a downward trending code), then the direction of upward and downward is known. For a downward trending code there is only one possible curve, while for an upward trending code there are two possible curves, and thus presenting an ambiguity. By evaluating the prior stage comparator output (C0,1), the uncertainty can be resolved. When comparator C0,1 has a low value (Logic 0), then the first curve is selected for the upward trending code, while a high value (Logic 1) must correspond to the third curve for the upward trending code. A similar ambiguity exists for STAGE 2, wherein there is a possibility of five upward trending codes and four downward trending codes. Comparator C2,3 can trip at five possible positions in an upward trending code. By looking back to the prior curve region from STAGE 1, the current folded region can be determined. Similarly, the ambiguity of the region selected for STAGE 3 is determined by prior curve region from STAGE 2, and the ambiguity of the region for STAGE 4 is resolved by the prior curve region from STAGE 3.

As illustrated in FIG. 3A, the second comparators (e.g., C1,2; C2,2, C3,2. C4,2) of each stage (e.g., STAGE N) are redundant with one of the comparators from the previous stage (e.g., STAGE N−1). For example, comparator C1,2 is redundant with comparator C0,1 in the downward trending region of waveform 311. Similarly, comparator C2,2 is redundant with comparator C1,1 in the second upward trending region of waveform 311; comparator C2,2 is redundant with comparator C1,2 in the second upward trending region of waveform 311; and comparator C2,2 is redundant with comparator C1,3 in the second upward trending region of waveform 311. Therefore, the encoder can be arranged to evaluate STAGE N−1 to localize the fold for STAGE N, and the encoder can also be arranged to correct the STAGE N−1s output as a form of redundant error correction using the comparator values from STAGE N and all later stages.

Figure 3B:
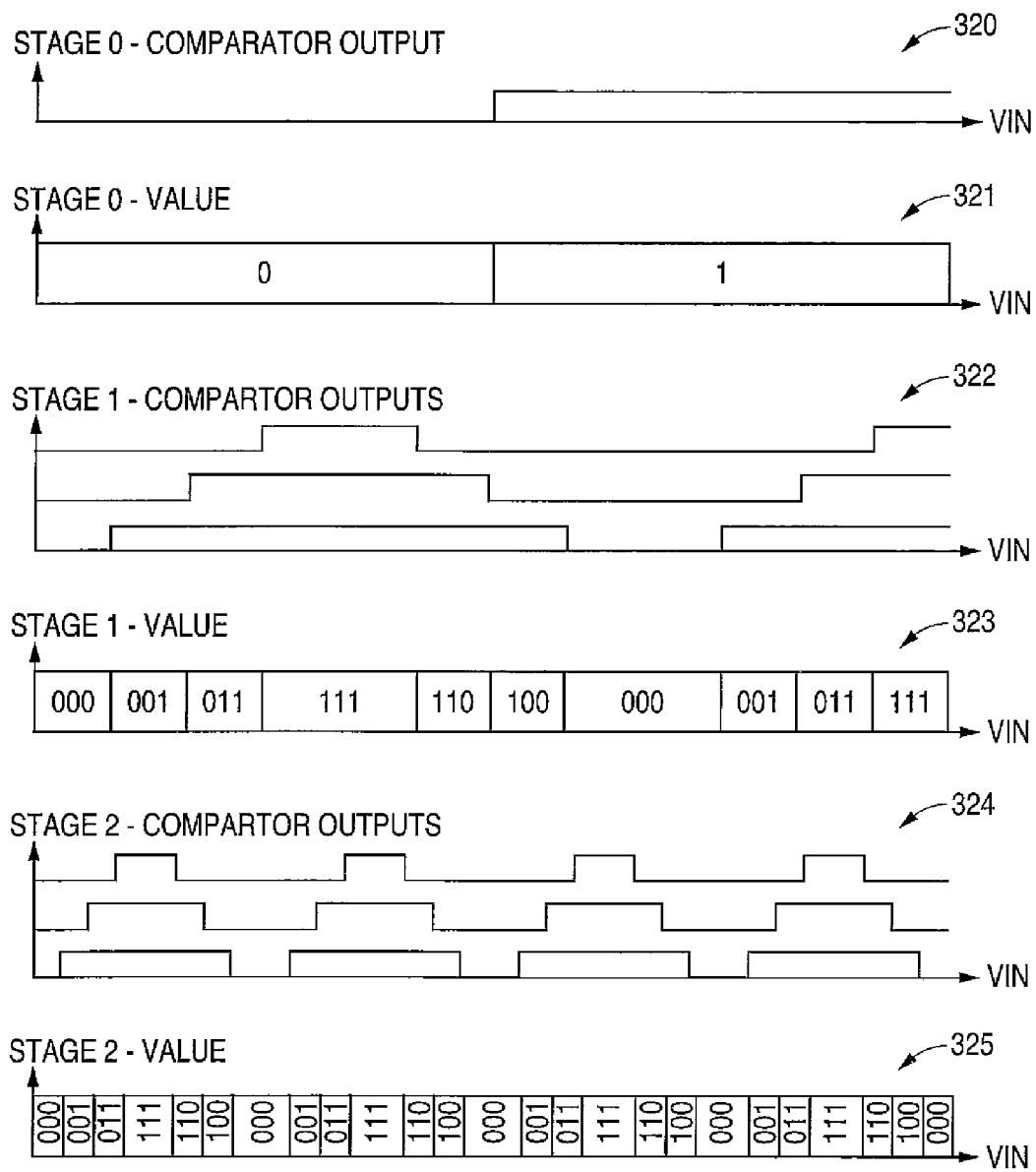
FIG. 3B is a waveform diagram further illustrating the operation of an example four stage folding ADC with a folding factor of three

FIG. 3B is a waveform diagram further illustrating the operation of an example four stage folding ADC with a folding factor of three, showing the comparator outputs as a function of input voltage (VIN). As illustrated by waveforms 320 and 321, the zero stage (STAGE 0) comparator (C1,0) provides a value of Logic 0 or Logic 1. As illustrated by waveforms 322 and 323, the first stage (STAGE 1) comparators (C1,1; C1,2; C1,3) provides cyclically coded values of 000,001,011,111 for upward trending codes, and 111,110, 100,000 for downward trending codes. As illustrated by waveforms 324 and 325, the second stage (STAGE 2) comparators (C2,1; C2,2; C2,3) provides cyclically coded values of 000,001,011,111 for upward trending codes, and 111,110, 100,000 for downward trending codes.

The recursive use of the previous folding stage as the coarse channel in the described unified architecture provides a robust localization method that determines the appropriate fold without using separate coarse comparators and coarse amplifiers (i.e., the coarse channel is used for this localization in the conventional systems). An added benefit of eliminating the coarse channel is that alignment is only required between successive stages, and the overall matching requirements of various circuits are relaxed.

As illustrated above, the cyclical coding of the comparators are encoded according to the folding factor, and thus the encoding is in base-3 for the above example. The output of the encoding should then be converted from the default base (base=folding factor) to base-2 so that conventional binary conversion is the result. The encoder can be arranged to provide this base-2 conversion.

To get the best static linearity, the LSBs and MSBs (plus all power-of-3 bits in between) need to give a consistent value for conversion of VIN to a digital quantity. Inconsistent conversion values may result from an input for any one comparator that is very close to a trip-point for the comparator (also call zero-crossing), where offsets in the comparator can lead to the comparator tripping and providing an incorrect bit value. This described inconsistency may occur even in the presence of reasonably small comparator or amplifier offsets. This inconsistency may result as a consequence of some comparators in STAGE N tripping at the same zero-crossing points at STAGE N−1. One proposed solution is to use STAGE N's middle comparator output to go back and correct the comparator values of STAGE N−1. For example, the encoder can replace the comparator value of comparator C1,3 (a comparator from STAGE 1) with the comparator value for comparator C2,2 (a comparator from STAGE 2). This correction can be applied recursively, starting with the last Stage and working backward so that all of the base-3 bits are perfectly aligned.

Figure 4A:
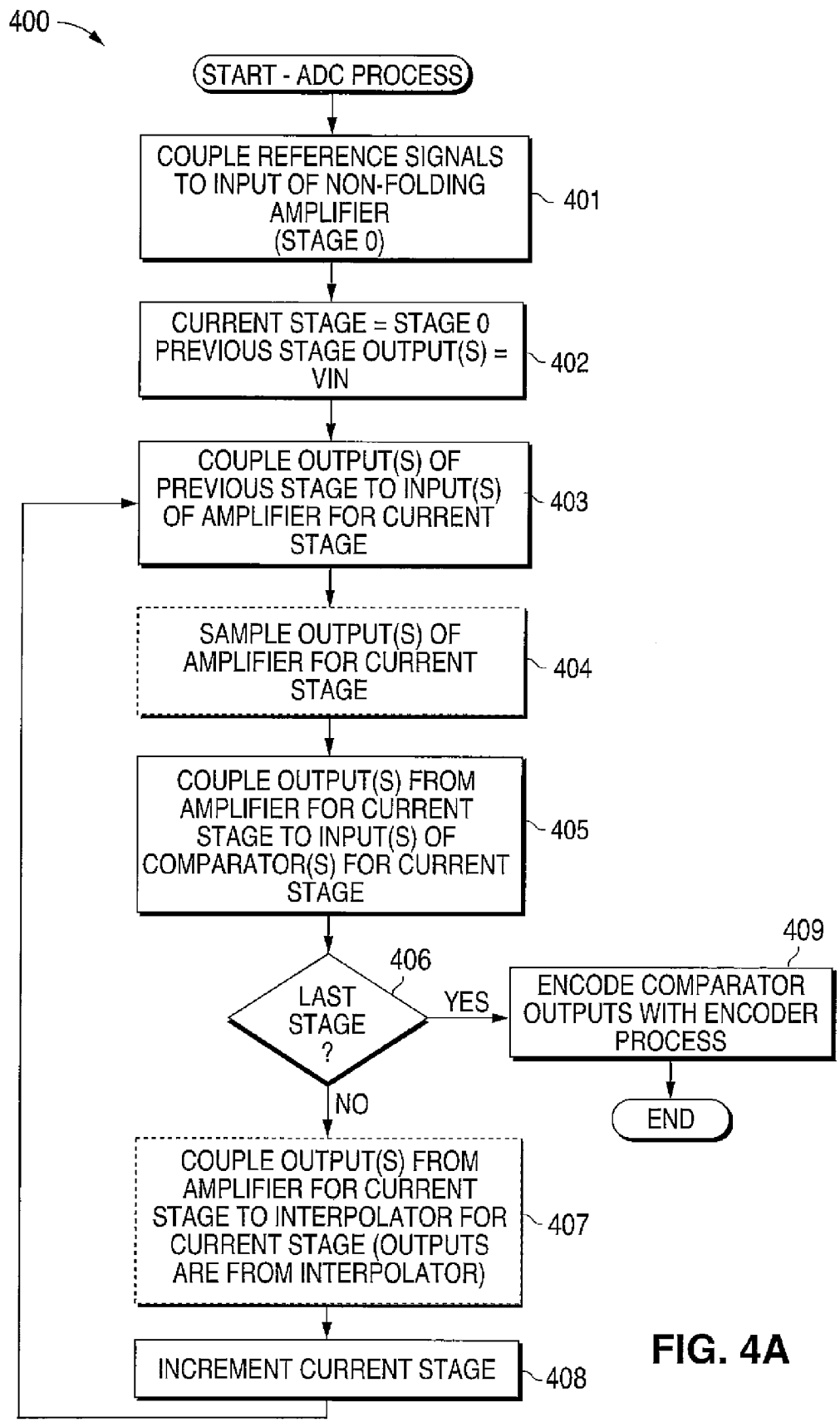
FIG. 4A is a flow diagram illustrating an example process flow (400) for an ADC circuit.

FIG. 4A is a flow diagram illustrating an example process flow (400) for an ADC circuit that is arranged in accordance with the present disclosure. Processing begins at block 401 where the reference signals (e.g., from a reference circuit) are coupled to a first set of inputs for the non-folding amplifier stage (STAGE 0). Continuing to block 402, the current stage is selected as STAGE 0, and the previous stage output is identified as the input signal (VIN).

After block 402, a processing loop comprised of blocks 403 through 408 begins. At block 403 the processes couples the previous stage output(s) to input(s) of the amplifier for the current stage. The amplifier for the current stage corresponds to a non-folding amplifier when the current stage is STAGE 0; otherwise the amplifier corresponds to a folding amplifier. Processing block 404 is an optional processing block that is used when pipelining is desired, where the outputs of the amplifier for the current stage are sampled before further processing. Continuing to block 405, the outputs of the amplifier (or optionally from the outputs from the sample and hold stage) for the current stage are coupled to input(s) of the comparator(s) for the current stage. Continuing to decision block 406, the process determines if the current stage is the last stage. When the current stage is the last stage then processing continues to block 409 where all of the comparator outputs are collectively used to encode the output signal (DOUT) according to the encoder process. Otherwise the processing continues to block 407. At block 407 the outputs of the amplifier (or optional from the outputs of the sample and hold stage) for the current stage are (optionally) coupled to the interpolator for the current stage. Continuing to block 408, the current stage is incremented to the next available stage and processing resumes at block 403.

Figure 4B:
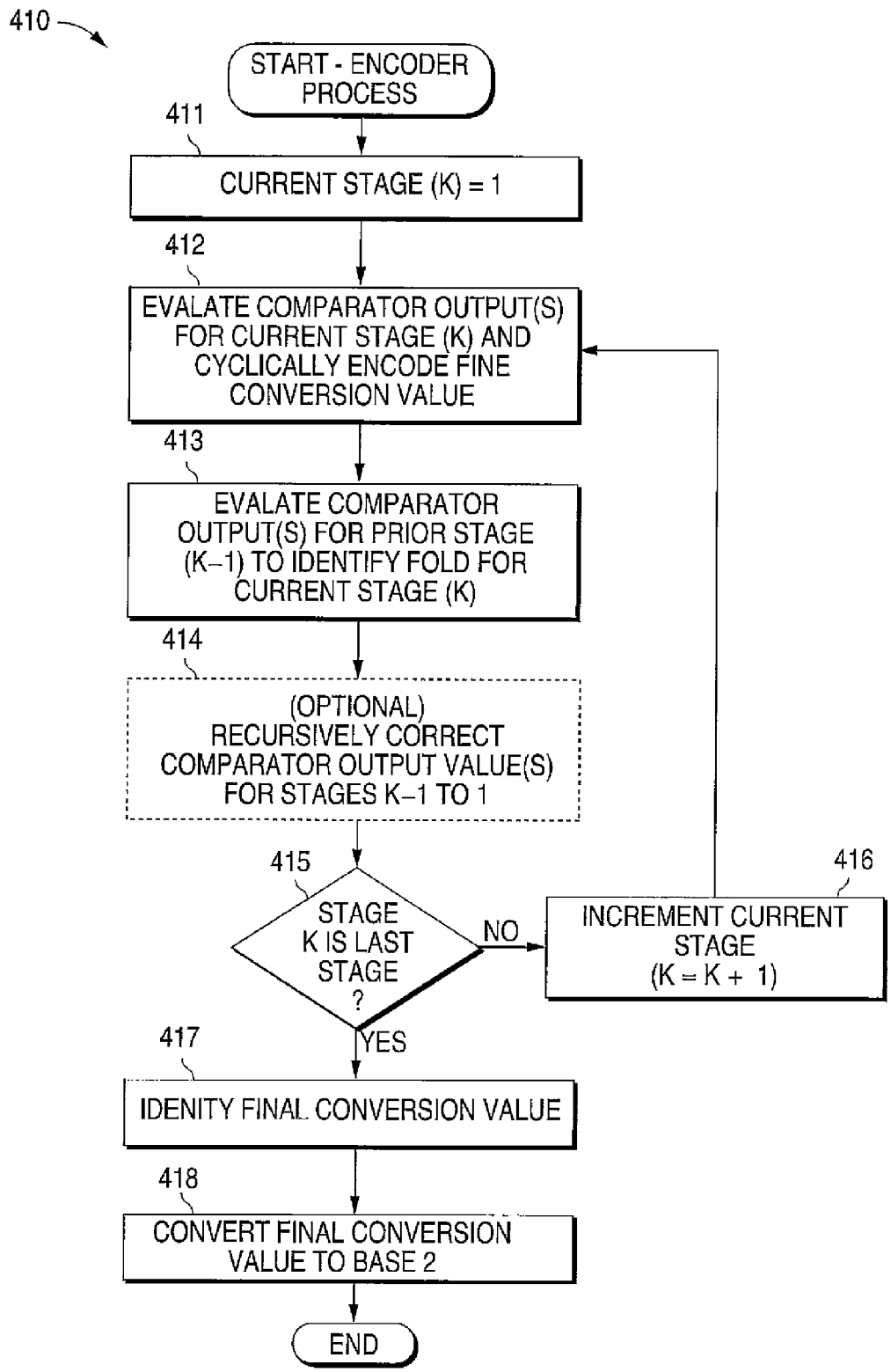
FIG. 4B is a flow diagram illustrating an example process flow (410) for an encoder circuit that is arranged in accordance with the present disclosure, all arranged in accordance with at least some aspects of the present disclosure.

FIG. 4B is a flow diagram illustrating an example process flow (410) for an encoder circuit that is arranged in accordance with the present disclosure. Processing begins at block

411 where the current stage (STAGE K) is selected as the first stage (STAGE 1). After block 411, a processing loop comprised of blocks 412 through 416 begins. At block 412 the process evaluates the comparator output(s) for the current stage (STAGE K) and cyclically encodes the fine conversion value in response thereto. Proceeding to block 413, the outputs of the prior stage (STAGE K−1) are evaluated to identify the fold for the current stage (STAGE K). Continuing to block 414, the process (optionally) applies a recursive process to correct the comparator output value(s) for stages K−1 to 1 as previously described above. Continuing to decision block 415, the process determines if the current stage (STAGE K) is the last stage in the conversion. When additional stages are to be processed, the current stage is incremented (K=K+1) and processing resumes at block 412. Otherwise, processing continues to block 417 wherein the final conversion value is identified. At block 418, the final conversion value can (optionally) be converter to base-2.

The encoder process can, in some examples, be provided by a general purpose processor core such as a microprocessor or microcontroller, which is programmed by either a firmware mechanism (e.g., a flash memory, a ROM, an EPROM, an EEPROM, etc.) or a software mechanism (e.g., a software media that is loaded at run time). In some other examples, the encoder process is provided with a logic array such as a programmable logic device (PLD), a gate array, or some other wired-logic circuit. In still other examples, the encoder process is a custom logic that is integrated together with the other portions of the ADC circuits.

Although many of the examples described herein include folding amplifier stages that each include the same folding factor, this is not a requirement. It is instead contemplated that each stage may have either the same folding factor or a different folding factor without departing from the spirit of the present disclosure. Also, each amplifier stage can have a folding factor of any desired value, including a folding factor of 1.

Although in some examples, the first amplifier stage is illustrated as a non-folding amplifier stage, this is not a requirement. It is instead understood that in some examples the first amplifier stage is a folding amplifier stage. It is further understood that in some examples the functions of the reference circuit and the first stage amplifier can be combined together. In still further appreciated that in some other examples the functions of the first stage amplifier and the following stage amplifier can be combined together.

Although many of the examples described herein include the same number of comparators for each stage (e.g., 3 comparators for each stage, except STAGE 0), this is not a requirement. For example, it may be desirable to have increased fine resolution on the last stage comparators so that additional resolution is achieved. In some examples, the first stage includes only a single comparator circuit, while in other examples the first stage includes more than one comparator circuit.

Although many of the examples described herein include fully differential amplifiers and/or fully differential comparators in each stage, this is not a requirement. It is instead contemplated that each stage may include either single-ended amplifiers or fully differential amplifiers. Moreover, it is contemplated that the comparators may likewise be either single-ended comparators or fully differential comparators.

Although many of the examples described herein include an interpolator circuit positioned between successively cascaded folding amplifier circuits, this is not a requirement. It is instead contemplated that in some implementations the interpolation circuit is eliminated, while in other implementation the interpolation circuit is desired. Moreover, the interpolation circuit can also be referred to as an averaging circuit in some instances without departing from the spirit of the present disclosure.

Although many of the illustrative examples describe sample and hold stages between amplifier and interpolator stages, this is not a requirement. It is instead contemplated that in some implementations no sample and hold stages are required. In some instances a limited portion of the amplifier stages can be used with corresponding sample and hold stages, while others do not use a sample and hold stage. In still other examples, the position of the sample and hold stage can be varied such that the output of one amplifier stage is coupled to a corresponding sample and hold stage that is not in the signal path to the next amplifier stage.

In some examples, the functions of the comparator stage can be integrated together with its corresponding amplifier stage. In some other examples, the functions of an amplifier stage and its corresponding interpolator stage can be combined together. In still some other examples, the functions of an amplifier stage and its corresponding sample and hold stage can be integrated together. In yet some other examples, the functions of the non-folding amplifier stage and the folding amplifier stage can be combined together. In still yet other examples, the functions of the reference circuit can be incorporated into one or more of the amplifier stages.

Although a recursive error-correction topology is described herein, the recursive error-correction is optional and may be eliminated in some systems. Furthermore, although recursive in concept, custom or synthesized logic may use high levels of parallelism and/or pipelining to minimize the computational delay of the encoder.

Although the preceding description describes various embodiments of the system, the invention is not limited to such embodiments, but rather covers all modifications, alternatives, and equivalents that fall within the spirit and scope of the invention. For example, the positioning of the various components may be varied, the functions of multiple components can be combined or divided, individual components may be separated into different components, or components can be substituted as understood in the art. Since many embodiments of the invention can be made without departing from the spirit and scope of the invention, the invention is not limited except as by the appended claims.

I claim:

1. An analog-to-digital converter apparatus comprising:
a non-folding amplifier stage and at least two folding amplifier stages arranged in a cascaded configuration, the non-folding amplifier stage configured to receive an analog input signal, each folding amplifier stage having a folding factor;
at least three comparator stages, each comparator stage configured to receive an output of one of the amplifier stages; and
an encoder configured to determine a digital output signal based on outputs of the comparator stages.

2. The apparatus of claim 1, further comprising:
at least two interpolator stages, each interpolator stage coupled to an input of one of the folding amplifier stages.

3. The apparatus of claim 1, further comprising:
a reference circuit configured to provide a reference signal to the non-folding amplifier stage.

4. The apparatus of claim 1, wherein the folding factors of the folding amplifier stages are equal to one another.

5. The apparatus of claim 1, wherein the folding factors of the folding amplifier stages are different from one another.

6. The apparatus of claim 1, wherein:
each folding amplifier stage comprises a fully differential amplifier stage configured to receive a differential input signal and to generate a differential output signal; and
each comparator stage is configured to receive the differential output signal from a corresponding one of the folding amplifier stages.

7. The apparatus of claim 1, wherein:
each folding amplifier stage comprises a single-ended amplifier stage configured to receive a single-ended input signal and to generate a single-ended output signal; and
each comparator stage is configured to receive the single-ended output signal from a corresponding one of the folding amplifier stages.

8. The apparatus of claim 1, wherein each folding amplifier stage comprises an array of individual amplifiers.

9. An analog-to-digital converter apparatus comprising:
at least two folding amplifier stages arranged in a cascaded configuration, each folding amplifier stage having a folding factor;
at least two interpolator stages, each interpolator stage coupled to an input of one of the folding amplifier stages;
at least two comparator stages, each comparator stage configured to receive an output of one of the amplifier stages; and
an encoder configured to determine a digital output signal based on outputs of the comparator stages.

10. An analog-to-digital converter apparatus comprising:
at least two folding amplifier stages arranged in a cascaded configuration each folding amplifier stage having a folding factor;
at least two sample and hold circuits, each sample and hold circuit configured to receive an output of one of the amplifier stages;
at least two comparator stages, each comparator stage configured to receive the output of one of the amplifier stages from one of the sample and hold circuits; and
an encoder configured to determine a digital output signal based on outputs of the comparator stages.

11. An analog-to-digital converter apparatus comprising:
at least two folding amplifier stages arranged in a cascaded configuration, each folding amplifier stage having a folding factor;
at least two comparator stages, each comparator stage configured to receive an output of one of the amplifier stages; and
an encoder configured to determine a digital output signal based on outputs of the comparator stages;
wherein each folding amplifier stage comprises an array of individual amplifiers;
wherein each individual amplifier includes an input terminal coupled to a bus of input terminals for the corresponding folding amplifier stage;
wherein each individual amplifier includes an output terminal coupled to a bus of output terminals for the corresponding folding amplifier stage; and
wherein a polarity of each individual amplifier is configured such that alternating groups of the individual amplifiers have alternating polarities to achieve the folding factor for the corresponding folding amplifier stage.

12. A method for converting an analog input signal into a digital output signal, the method comprising:
processing the analog input signal using a non-folding amplifier stage and multiple folding amplifier stages arranged in a cascaded configuration, each folding amplifier stage having a folding factor;
receiving outputs from the non-folding and folding amplifier stages at multiple comparator stages;
providing outputs from the comparator stages to an encoder; and
generating the digital output signal using the encoder based on the outputs of the comparator stages.

13. The method of claim 12, further comprising:
providing a reference signal to the non-folding amplifier stage.

14. A method for converting an analog input signal into a digital output signal, the method comprising:
processing the analog input signal using multiple folding amplifier stages arranged in a cascaded configuration, each folding amplifier stage having a folding factor;
receiving outputs from the folding amplifier stages at multiple comparator stages;
interpolating the output of a preceding folding amplifier stage in the cascaded configuration and providing the interpolated output as an input to a subsequent folding amplifier stage in the cascaded configuration;
providing outputs from the comparator stages to an encoder; and
generating the digital output signal using the encoder based on the outputs of the comparator stages.

15. A method for converting an analog input signal into a digital output signal, the method comprising:
processing the analog input signal using multiple folding amplifier stages arranged in a cascaded configuration, each folding amplifier stage having a folding factor;
receiving outputs from the folding amplifier stages at multiple comparator stages;
providing outputs from the comparator stages to an encoder; and
generating the digital output signal using the encoder based on the outputs of the comparator stages, wherein generating the digital output signal comprises using an encoding process to determine the digital output signal based on the outputs of the comparator stages without evaluating separated coarse channel results.

16. The method of claim 15, wherein the encoding process comprises identifying a final conversion value for the digital output signal by:
evaluating the outputs from the comparator stages;
identifying a conversion value for each of the evaluated outputs; and
identifying a fold associated with each of the evaluated outputs.

17. The method of claim 15, wherein the encoding process comprises:
selecting each of the comparator stages in succession;
for a currently-selected comparator stage:
evaluating the output from the currently-selected comparator stage and cyclically encoding a conversion value; and
evaluating the output from a previously-selected comparator stage and identifying a fold for the currently-selected comparator stage; and
identifying a final conversion value for the digital output signal from the identified folds and the cyclically encoded conversion values.

18. The method of claim 15, wherein the encoding process comprises:
selecting each of the comparator stages in succession;
for a currently-selected comparator stage:
evaluating the output from the currently-selected comparator stage and cyclically encoding a conversion value;

evaluating the output from a previously-selected comparator stage and identifying a fold for the currently-selected comparator stage; and recursively correcting the conversion value for the currently-selected comparator stage based on at least one conversion value for at least one previously-selected comparator stage; and identifying a final conversion value for the digital output signal from the identified folds and the cyclically encoded conversion values.

19. A method for converting an analog input signal into a digital output signal, the method comprising:

processing the analog input signal using multiple folding amplifier stages arranged in a cascaded configuration, each folding amplifier stage having a folding factor;

sampling the outputs from the folding amplifier stages with sample and hold stages;

receiving outputs from the sample and hold stages at multiple comparator stages;

providing outputs from the comparator stages to an encoder; and generating the digital output signal using the encoder based on the outputs of the comparator stages.

20. An analog-to-digital converter system comprising:

a first amplifier stage configured to receive an analog input signal, the first amplifier stage comprising a non-folding amplifier stage;

a reference circuit configured to provide a reference signal to the first amplifier stage;

at least two folding amplifier stages arranged in a cascaded configuration, a first of the folding amplifier stages coupled to the first amplifier stage, each folding amplifier stage having a folding factor;

at least three comparator stages, each comparator stage configured to receive an output of one of the amplifier stages; and an encoder configured to determine a digital output signal based on outputs of the comparator stages.

\* \* \* \* \*